(12) United States Patent
Sun et al.

(10) Patent No.: US 10,353,113 B2
(45) Date of Patent: Jul. 16, 2019

(54) RESPONSE SURFACE METHOD FOR IDENTIFYING THE PARAMETERS OF BURGERS MODEL FOR SLOPE SOIL

(71) Applicant: POWERCHINA HUADONG ENGINEERING CORPORATION LIMITED, Hangzhou, Zhejiang (CN)

(72) Inventors: Miaojun Sun, Zhejiang (CN); Mingyuan Wang, Zhejiang (CN); Zhigang Shan, Zhejiang (CN)

(73) Assignee: Powerchina Huadong Engineering Corporation Limited, Zhejiang (CN)

( * ) Notice: Subject to any disclaimer, the term of this patent is extended or adjusted under 35 U.S.C. 154(b) by 324 days.

(21) Appl. No.: 15/333,431

(22) Filed: Oct. 25, 2016

(65) Prior Publication Data

US 2017/0293048 A1   Oct. 12, 2017

(30) Foreign Application Priority Data

Apr. 9, 2016   (CN) .......................... 2016 1 0220850

(51) Int. Cl.
*G06F 17/50* (2006.01)
*G01V 99/00* (2009.01)
*G06F 17/11* (2006.01)

(52) U.S. Cl.
CPC ............ *G01V 99/005* (2013.01); *G06F 17/11* (2013.01); *G06F 17/5009* (2013.01)

(58) Field of Classification Search
CPC .......................... G06F 17/5009; G01V 99/005
USPC ............................................. 703/2, 6; 702/5
See application file for complete search history.

(56) References Cited

U.S. PATENT DOCUMENTS

| 2011/0106451 A1* | 5/2011 | Christy ................ G01N 21/359 702/5 |
| 2014/0156232 A1* | 6/2014 | Cordazzo ............ G06F 17/5018 703/2 |
| 2017/0067183 A1* | 3/2017 | Seki .......................... C30B 9/12 |

* cited by examiner

*Primary Examiner* — Thai Q Phan
(74) *Attorney, Agent, or Firm* — Muncy, Geissler, Olds & Lowe, P.C.

(57) ABSTRACT

The invention claims a response surface method for identifying the parameters of Burgers model for slope soil, comprising the following steps: determine the model parameters and the level thereof; determine the parameter combination and the test sequence of the numerical test; calculate the response equation; optimally identify the model parameters. Based on the combination of the laboratory test, the numerical simulation and the field monitoring, the response surface analysis method is adopted in the invention to determine the regression equation for the parameters of Burgers model and the slope surface displacement, and meanwhile the regression analysis is adopted to establish the optimal parameter combination.

7 Claims, 4 Drawing Sheets

RESPONSE SURFACE METHOD FOR IDENTIFYING THE PARAMETERS OF BURGERS MODEL FOR SLOPE SOIL

FIELD OF THE INVENTION

The present invention belongs to the field of the geotechnical engineering, specifically relating to Burgers rheological parameter identification method for slope soil combining the laboratory test, in-situ monitoring and numerical simulation based on the response surface design.

Creep slopes widely exist in the engineering construction. Burgers model is an ideal rheological model for describing the stable creep soil mass. And the constitutive parameter identification thereof is one of the important tasks in the rheological behavior analysis for rock and soil. The parameter identification methods for rock and soil are usually divided into the positive method and the inverse analysis method, wherein the accurate precondition of the positive method is based on the knowledge of the stress state. However, it is difficult to accurately obtain the actual stratum stress state, thus the practical application of the positive analysis method is limited. Therefore, the inverse analysis method is more widely applied in practical engineering constructions.

The displacement monitoring method, which monitors slope displacement, is mainly adopted in the slope monitoring field. And meanwhile, the displacement is regarded as the most vital data for the prediction of slope deformation evolution. The displacement inversion has gradually become the most universal method applied in the inverse analysis of displacement. Artificial intelligence methods such as neural network and particle swarm optimization are usually adopted in an inverse displacement analysis, but the accuracy of such artificial intelligence methods is based on plenty of learning samples. In other words, a lot of manpower and material resources are consumed in engineering practice due to the needs for tests and monitoring data.

The identification of the rheological parameters is substantially an optimization process in terms of statistical significance. The response surface design is one of the statistical method for solving the multivariable problems. This method can not only evaluates the influence of various input parameters on the output response value, but also provides the quantitative relationship between the main influence factors and the response values. Thus the response surface design is superior to the artificial intelligence method in the aspect of quantitative evaluation. In the geotechnical engineering field, the response surface method is mainly applied to the reliability analysis and the parameter optimization design of the numerical calculation model, but has not yet been researched for optimizing and identifying the rheological parameters of the soil mass.

CONTENT OF THE INVENTION

The invention technically aims to provide a response surface method for identifying the parameters of Burgers model for the slope soil.

The technical scheme adopted for the technical problem solved by the invention is as follows: a response surface method for identifying the parameters of Burgers model for slope soil includes the following steps:

Step 1: determine the model parameters and the level thereof;

Step 2: determine the parameter combination and the sequence of the numerical tests;

Step 3: calculate the response surface equation;

Step 4: optimize the model parameters.

Besides the above technical scheme, the following further technical scheme can be adopted or combined in the invention:

Step 1 specifically includes the following sub-steps:

1) Determine four parameters to be identified, namely $E_0$, $\eta_1$, $E_1$ and $\eta_2$, according to Burgers model;

2) Take the undisturbed sample near the sliding surface of the slope and carry out the laboratory triaxial rheological tests for the undisturbed samples;

3) Adopt the fitting function module to fit the test curve and determine the upper level value, the lower level value and the zero level value of each parameter in sub-step 1).

Burgers model equation is $$\varepsilon(t) = \frac{\sigma}{\eta_2}t + \frac{\sigma}{E_0} + \frac{\sigma}{E_1}\left[1 - \exp\left(-\frac{E_1}{\eta_1}t\right)\right].$$

Step 2 specifically includes the following sub-steps: select four rheological parameters as independent variable $x_i$, and select the simulated value of the surface displacement at the middle of the slope as dependent variable $y_i$, and design the test according to Box-Behnken design, and determine the test scheme for fours factors and three levels, and prepare the corresponding scheme table.

Step 3 specifically includes the following sub-steps: establish 3D slope model according to the altitude data and the drilling data of the slope measurement, and carry out the numerical simulation according to the parameter combination and the test sequence determined in step 2, and establish the polynomial regression model for the independent variable and the dependent variable.

Step 4 specifically includes the following sub-steps:

1) Set GPS monitoring pillar at the middle of the principal section of the slope and monitor the surface displacement;

2) After the slope deformation rate becomes stable, take the four surface displacement data as the target values to solve the response surface equation in step 3, and establish four Burgers model parameter organizations;

3) Take the mean value of each parameter as the final value to identify the parameters of Burgers model.

The method also comprises the step for the inversely identifying the parameters of Burgers model for slope soil after step 4, wherein this step specifically includes the following sub-steps:

1) Input the parameters optimized in step 4 into 3D numerical model for slope for relevant calculation;

2) Simulate and monitor the correlation coefficient of the displacement-time series curve;

3) Judge the value obtained in previous step: if the value is less than or equal to 0.85, return to step 1 and recalculate to step 4, and repeat the calculation till the value is more than 0.85.

The effects of the invention are as follows: Combining the laboratory test, the numerical simulation and the field monitoring, the response surface method is adopted in the invention to determine the parameters of Burgers model and the regression equation of the slope surface displacement. And meanwhile, the regression analysis is adopted to establish the optimized parameter combination. The method avoids a lot testing and field monitoring work for inputting massive testing and monitoring data, and only a few of triaxial rheological tests and numerical simulation tests are adopted to accurately and effectively identify the parameters of Burgers model for slope soil through the displacement monitoring data and the response surface method, and the model parameter combination identified thereby is accurate and reliable, thus providing effective support for the displacement prediction, the security monitoring and the scientific preventive control of the slope.

Figure 1:
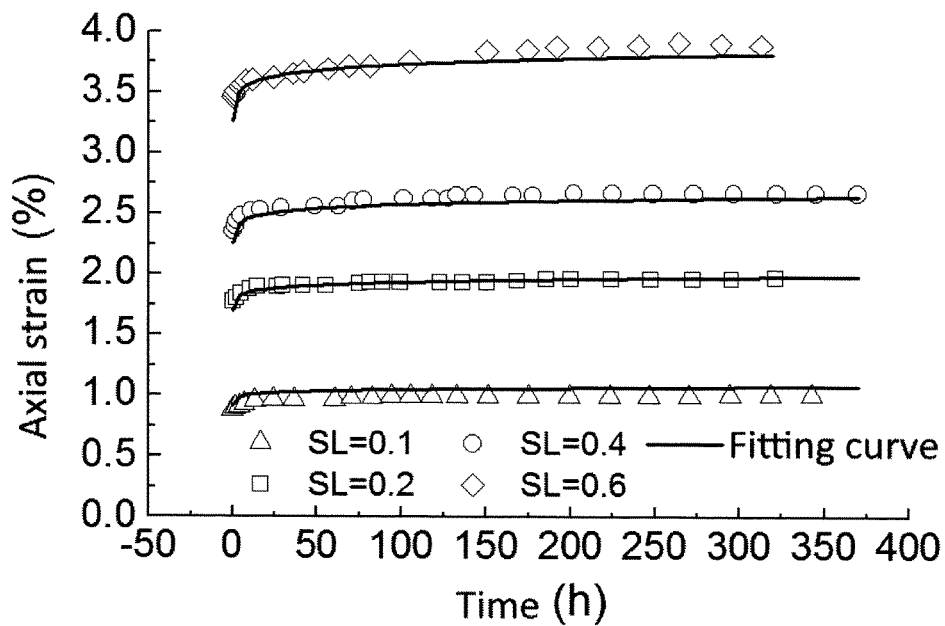
FIG. 1 is a rheological test fitting curve under the confining pressure of 100 kPa.
Figure 2:
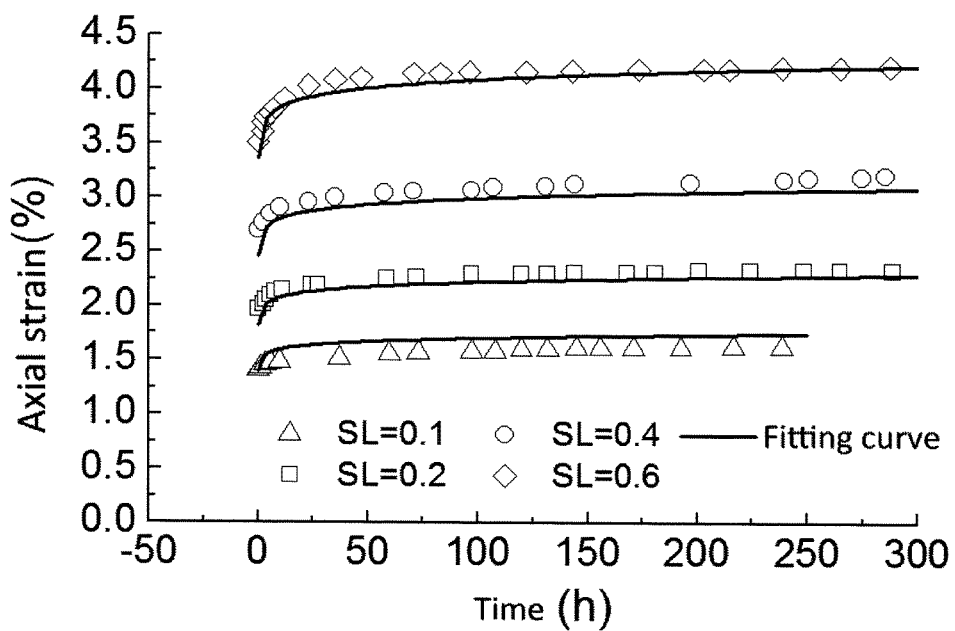
FIG. 2 is a rheological test fitting curve under the confining pressure of 200 kPa.
Figure 3:
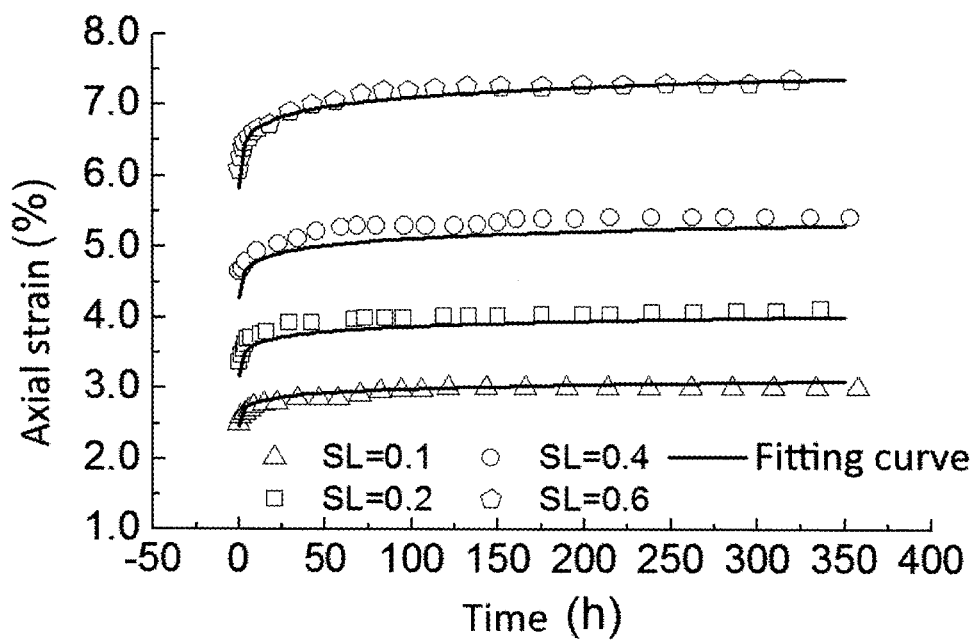
FIG. 3 is a rheological test fitting curve under the confining pressure of 400 kPa
Figure 4:
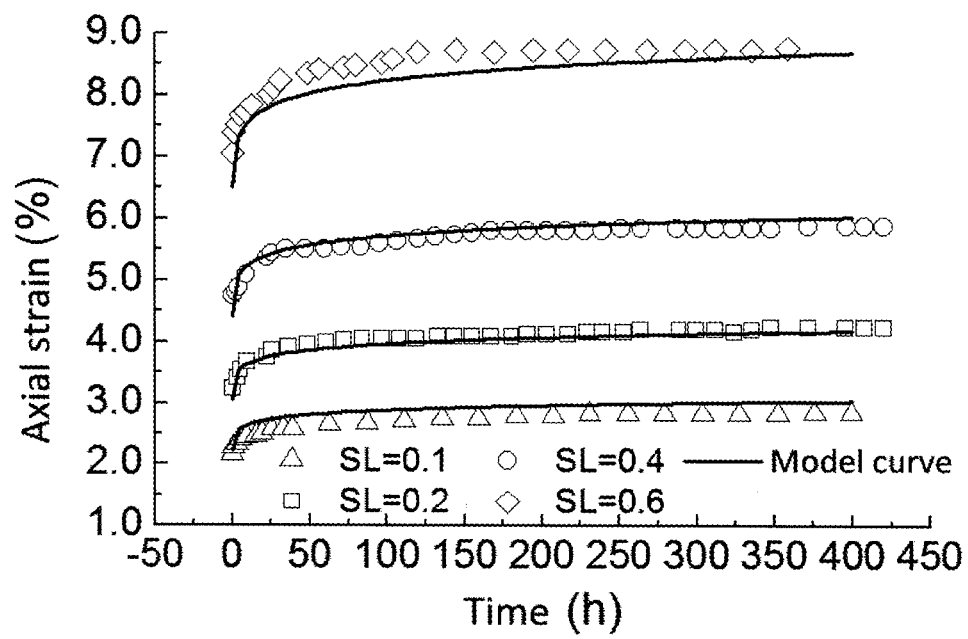
FIG. 4 is a rheological test fitting curve under the confining pressure of 600 kPa
Figure 5:
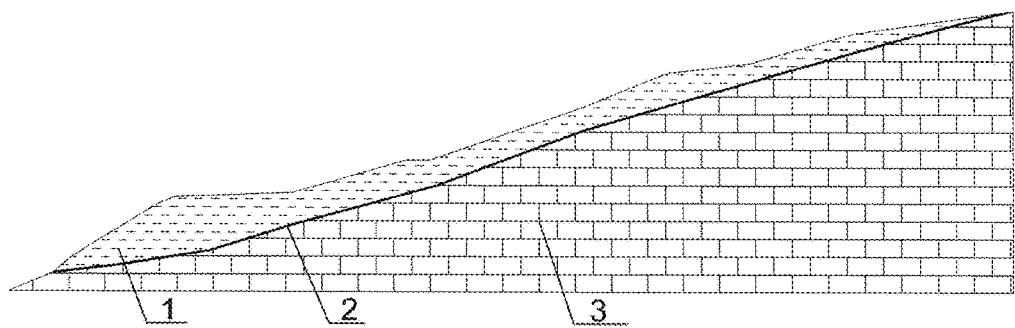
FIG. 5 is a longitudinal profile of the numerical model for slope.
Figure 6:
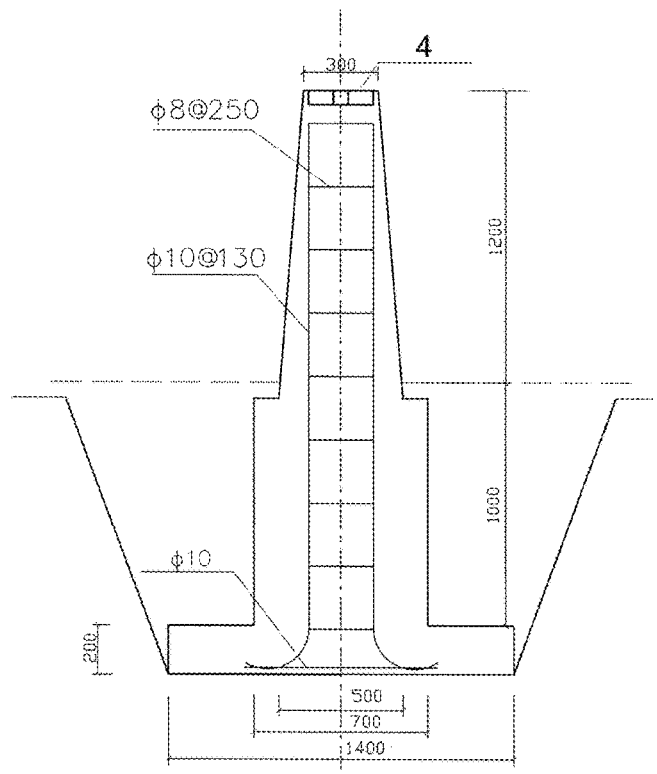
FIG. 6 is a structural diagram of GPS monitoring pillar for slope.
Figure 7:
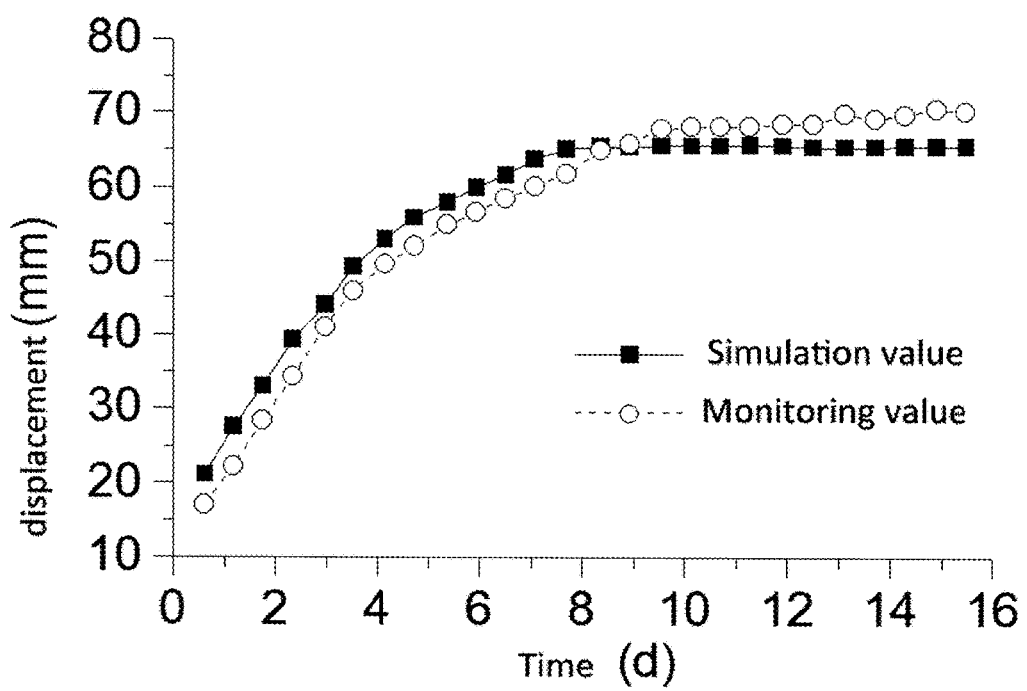
FIG. 7 shows the slope displacement monitoring data and the simulation curve.

Therein: 1—sliding mass, 2—sliding zone, 3—sliding bed, 4—centering plate.

DETAILED DESCRIPTION OF THE EMBODIMENTS

In the following drawings, the identification of the rheological parameters of the homogeneous slope soil along a highway is taken as the research example to describe the implementation steps of the invention in detail:

Step 1: determine the model parameters and the level thereof: determine four parameters, namely $E_0$, $\eta_1$, $E_1$ and $\eta_2$, as the inverse identification parameters according to the constitutive equation of Burgers model; take the undisturbed sample at a deep place of the sliding surface of the slope according to the *Technical Standard for Undisturbed Soil Sampling* (JGJ89-92), and carry out the large-dimension laboratory triaxial test rheological test through the triaxial test compression apparatus in SY250 stress control laboratory according to the *Standard for Soil Test Method* (GB/T50123-1999), wherein the test sample dimension is $\Phi130$ mm×300 mm and the solidification confining pressures is respectively 0.1, 0.2, 0.4 and 0.6 MPa; carry out the triaxial test drainage shear test under a constant confining pressure after solidification completion, wherein the shearing rate is controlled as 0.005 mm/min, and the central axis pressure, the pore water pressure and the axial deformation during the test process are all automatically collected by the microcomputer; end the test till the strain value is 15%.

After obtaining the creep curves of the soil mass respectively under the confining pressures of 0.1, 0.2, 0.4 and 0.6 MPa, use origin software to customize the fitting curve of the function module to preliminarily determine the test values of the corresponding parameters of a rheological model for the large-dimension rheological test under different confining pressures and determine the upper level value, the lower level value and the zero level value of the model parameters, respectively represented by 1, −1 and 0. Table 1 shows the level setting of the model parameters:

TABLE 1

Parameter Level Table of Burgers Model for Soil Mass

| Model Parameters | E0/Mpa | E1/Mpa | η1/Mpa · d | η2/Mpa · d |
|---|---|---|---|---|
| Lower Level (−1) | 2.24 | 1.03 | 110.51 | 982.00 |
| Zero Level (0) | 3.00 | 1.92 | 260.62 | 1496.00 |
| Upper Level (+1) | 3.76 | 2.81 | 410.73 | 2010.00 |

Step 2: design the numerical test scheme: take four model parameters $E_0$, $\eta_1$, $E_1$ and $\eta_2$ as independent variable array X, respectively marked as $x_1$, $x_2$, $x_3$ and $x_4$; take the surface displacement obtained by the numerical simulation at the middle of the slope as the dependent variable marked as $y_1$; design the test for the above four factors under the three levels shown in the above table according to Box-Behnken design; carry out the test containing five repeated central points correspondingly for 29 times. The design sequence and the factor combination of the numerical test are as shown in Table 2:

TABLE 2

Factor Combination & Test Result Table

| No. | $x_1$ | $x_2$ | $x_3$ | $x_4$ | $y_1$ |
|---|---|---|---|---|---|
| 1 | −1 | 1 | 0 | 0 | 83.022 |
| 2 | 0 | −1 | 0 | 1 | 91.001 |
| 3 | 0 | −1 | −1 | 0 | 87.365 |
| 4 | −1 | 0 | 0 | −1 | 78.881 |
| 5 | 1 | −1 | 0 | 0 | 84.032 |
| 6 | −1 | −1 | 0 | 0 | 80.295 |
| 7 | 0 | 0 | 0 | 0 | 87.163 |
| 8 | 1 | 0 | 1 | 0 | 82.820 |
| 9 | 0 | 0 | 1 | 1 | 89.284 |
| 10 | 0 | 0 | 0 | 0 | 87.163 |
| 11 | 0 | 1 | −1 | 0 | 81.911 |
| 12 | 0 | −1 | 1 | 0 | 81.810 |
| 13 | 0 | 0 | −1 | 1 | 85.042 |
| 14 | 0 | 1 | 0 | −1 | 81.002 |
| 15 | 1 | 1 | 0 | 0 | 83.022 |
| 16 | 0 | 0 | 0 | 0 | 87.163 |
| 17 | 0 | 0 | 0 | 0 | 87.163 |
| 18 | −1 | 0 | 0 | 1 | 90.900 |
| 19 | −1 | 0 | −1 | 0 | 80.093 |
| 20 | 1 | 0 | −1 | 0 | 85.951 |
| 21 | 0 | 0 | 1 | −1 | 77.265 |
| 22 | 1 | 0 | 0 | −1 | 82.921 |
| 23 | 0 | 0 | 0 | 0 | 87.163 |
| 24 | 0 | −1 | 0 | −1 | 81.002 |
| 25 | −1 | 0 | 1 | 0 | 81.911 |
| 26 | 1 | 0 | 0 | 1 | 89.89 |
| 27 | 0 | 1 | 0 | 1 | 91.203 |
| 28 | 0 | 0 | −1 | −1 | 78.780 |
| 29 | 0 | 1 | 1 | 0 | 86.456 |

Step 3: calculate a surface response model by: convert the altitude data of the slope into an stl file of the triangular facet data and import it into FLAC3D to form a 3D slope model; orderly carry out 3D numerical simulation for the slope according to the parameter values of the 29 sample points determined in step 2 and the test sequence shown in the above table to obtain 29 groups of simulation data for dependent variable y1, as shown in the above table; analyze the variance according to the 29 groups of simulation data shown in the above table and the corresponding independent variable combination, and adopt Design-Expert software for the significance test for the model and various coefficients thereof: if the correlative item P in the inspection result is less than or equal to 0.05, it is indicated that this item has significant influence on the response index; if P is less than or equal to 0.01, it is indicated that this item has extremely significant influence on the response index; if P is more than 0.05, it is indicated that this item has insignificant influence on the response index and can be eliminated from the model; similarly, if P is less than or equal to 0.05, it is indicated that the response index has significant relationship with the regression equations of various items, and the equations can be adopted to represent the relationship between the index and the parameters. The variance analysis results are as shown in the following table:

TABLE 3

Model and Parameter Item Variance Analysis Table

| Item | Quadratic Sum | Degree of Freedom | Mean Square | F Value | P Value |
|---|---|---|---|---|---|
| 模型 Model | 407.69 | 14 | 29.12 | 13.15 | <0.0001 |
| A | 15.26 | 1 | 15.26 | 6.89 | 0.02 |
| B | 0.1 | 1 | 0.1 | 0.046 | 0.8325 |
| C | 0.014 | 1 | 0.014 | 0.006 | 0.9386 |
| D | 275.22 | 1 | 275.22 | 124.27 | <0.0001 |
| AB | 3.49 | 1 | 3.49 | 1.58 | 0.2298 |
| AC | 6.12 | 1 | 6.12 | 2.76 | 0.1186 |
| AD | 6.38 | 1 | 6.38 | 2.88 | 0.1119 |
| BC | 25.5 | 1 | 25.5 | 11.52 | 0.0044 |
| BD | 0.01 | 1 | 0.01 | 0.005 | 0.9469 |
| CD | 8.29 | 1 | 8.29 | 3.74 | 0.0736 |
| $A^2$ | 28.83 | 1 | 28.83 | 13.02 | 0.0029 |
| $B^2$ | 7.3 | 1 | 7.3 | 3.29 | 0.091 |
| $C^2$ | 48.68 | 1 | 48.68 | 21.98 | 0.0003 |
| $D^2$ | 1.2 | 1 | 1.2 | 0.54 | 0.4747 |
| Residual Error | 31.01 | 14 | 2.21 | / | / |
| Non-fitting Item | 31.01 | 10 | 3.1 | / | / |
| Pure Error | 0 | 4 | 0 | / | / |
| Total Error | 438.69 | 28 | / | / | / |

According to P values shown in the above table, monomial item $x_4(\eta_2)$ has extremely significant influence on $y_1$, $x_1(E_0)$ has significant influence on $Y_1$, $x_2(\eta_1)$ and $x_3(E_0)$ both have insignificant influence; only $x_2*x_3$ among the interactive items has significant influence; $x_1^2$ and $x_3^2$ among the quadratic items have significant influence on $y_1$, and other quadratic items have insignificant influence.

The quadratic polynomial is adopted for fitting, and Design-Expert software is adopted to establish the polynomial regression model for the independent variable and the dependent variable. The model equation is as shown in the following formula:

$y_1 = 87.16 + 15.26x_1 + 25.50x_2x_3 + 275.22x_4 + 28.83x_1^2 + 48.68x_3^2$

Step 4: optimally identify the model parameters: periodically obtain the data to form the displacement-time series curve through setting GPS monitoring pillar at the middle of the principal section of the slope for monitoring the surface displacement; after the deformation rate of the slope is basically unchanged, take the surface displacements on the 8$^{th}$, 10$^{th}$, 12$^{th}$ and 14$^{th}$ days as the target values of the solution; adopt Design-Expert software to establish the regression model according to the polynomial solving step 3 in order to respectively establish the optimal organizations of the four parameters of Burgers model; take the mean value of each parameter as the final value to finally identify the parameters of Burgers model, wherein the parameters of Burgers model for slope soil are respectively $E_0$=2.85 MPa, $\eta_1$=305.23 MPa·d, $E_1$=2.70 MPa and $\eta_2$=195.35 MPa·d; input the optimized parameters into 3D numerical model for slope for relevant calvualtion; adopt origin software to calculate, simulate and monitor the correlation coefficient of the displacement-time series curve as 0.92 which meets the accuracy requirement, thus indicating that the parameters identified thereby can relatively accurately predict the surface displacement of the slope.

The invention claimed is:

1. A method for identifying parameters of Burgers model for slope soil, comprising the following steps:
   Step 1: determine the parameters of the Burgers model and a level of each of the parameters by sampling the slope soil and testing the parameters for at least one sample;
   Step 2: determine a combination of the parameters and a test sequence of a numerical test;
   Step 3: calculate a response surface equation utilizing altitude data and drilling data measured from the slope soil in a 3D slope model;
   Step 4: optimize the parameters by inserting a GPS monitoring pillar into the slope soil and measuring displacement over time, determining stability of the slope soil, and if the slope soil is stable, selecting displacement data with which to optimize the parameters.

2. The method for identifying the parameters of Burgers model for slope soil according to claim 1, wherein step 1 specifically includes the following sub-steps:
   1) Determine four parameters to be identified, namely $E_0$, $\eta_1$, $E_1$ and $\eta_2$, according to the Burgers model, wherein $E_0$ is a first pressure, $\eta_1$ is a first pressure applied over distance, $E_1$ is a second pressure, and $\eta_2$, is a second pressure applied over distance;
   2) Take at least one undisturbed sample near a sliding surface of the slope soil and carry out a laboratory triaxial test rheological test for the at least one undisturbed sample;
   3) Adopt a fitting function module to fit a test curve and determine the upper level value, the lower level value, and the zero level value of each parameter of the Burgers model.

3. The method for identifying the parameters of Burgers model for slope soil according to claim 2, wherein Burgers model equation is $$\varepsilon(t) = \frac{\sigma}{\eta_2}t + \frac{\sigma}{E_0} + \frac{\sigma}{E_1}\left[1 - \exp\left(-\frac{E_1}{\eta_1}t\right)\right].$$

4. The method for identifying the parameters of Burgers model for slope soil according to claim 1, wherein step 2 specifically includes the following sub-steps:
   select four rheological parameters as independent variable xi, and select a simulated value of surface displacement at a middle of the slope soil as dependent variable yi, and design the numerical test according to Burgers matrix sampling method, and
   determine a test scheme for four factors under the three levels, and prepare the corresponding scheme table.

5. The method for identifying the parameters of Burgers model for slope soil according to claim 4, wherein step 3 specifically includes the following sub-steps:
   establish the 3D slope model according to the altitude data and the drilling data measurements of the slope soil, and carry out a numerical simulation according to the combination of the parameters and the test sequence determined in step 2,
   and establish a polynomial regression model for the independent variable and the dependent variable.

6. The method for identifying the parameters of Burgers model for slope soil according to claim 1, wherein step 4 specifically includes the following sub-steps:
 1) Set the GPS monitoring pillar at a middle of a principal section of the slope soil and monitor surface displacement;
 2) After a slope deformation rate of the slope soil becomes stable, measure four surface displacement data as target values to solve the response surface equation in step 3, and establish four Burgers model parameter organizations;
 3) Utilize the mean value of each of the parameters as a final value to provide the parameters of into Burgers model.

7. The response surface method for identifying the parameters of Burgers model for slope soil according to claim 1, also comprising the step for inversely identifying the parameters of Burgers model for slope soil after step 4, wherein this step specifically includes the following sub-steps:
 1) Input the parameters optimized in step 4 into 3D numerical model for slope for relevant calculation;
 2) Simulate and monitor a correlation coefficient of a displacement-time series curve;
 3) Judge the correlation coefficient obtained in previous step: if the value is less than or equal to 0.85, return to step 1 and recalculate step 4, and repeat the calculation of step 4 till the value is more than 0.85.

* * * * *